(12) United States Patent
Makarovic et al.

(10) Patent No.: US 8,680,721 B2
(45) Date of Patent: Mar. 25, 2014

(54) COIL, POSITIONING DEVICE, ACTUATOR, AND LITHOGRAPHIC APPARATUS

(75) Inventors: Juraj Makarovic, Kosice-Barca (SK); Rody Koops, Eindhoven (NL); Tom Van Zutphen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 487 days.

(21) Appl. No.: 12/792,418

(22) Filed: Jun. 2, 2010

(65) Prior Publication Data

US 2010/0321664 A1 Dec. 23, 2010

Related U.S. Application Data

(60) Provisional application No. 61/218,692, filed on Jun. 19, 2009.

(51) Int. Cl.
*H02K 41/00* (2006.01)
*G03B 27/58* (2006.01)
*G03F 7/20* (2006.01)
*H02K 3/04* (2006.01)
*H02K 3/40* (2006.01)
*H02K 41/035* (2006.01)

(52) U.S. Cl.
CPC .............. *G03F 7/70758* (2013.01); *H02K 3/04* (2013.01); *H02K 3/40* (2013.01); *H02K 41/0354* (2013.01); *H02K 2201/18* (2013.01)
USPC ......................... 310/12.22; 355/72; 310/12.06

(58) Field of Classification Search
CPC ...... G07F 7/70758; H02K 1/145; H02K 3/04; H02K 3/32; H02K 3/40; H02K 41/0354; H02K 41/0356; H02K 2201/18
USPC .................. 355/53, 72, 75; 310/12.01, 12.02, 310/12.04–12.06, 12.21–12.23, 12.29, 310/12.31
See application file for complete search history.

(56) References Cited

U.S. PATENT DOCUMENTS

| | | | | |
|---|---|---|---|---|
| 3,102,161 | A * | 8/1963 | Raisbeck | 174/127 |
| 4,308,476 | A * | 12/1981 | Schuler | 310/45 |
| 5,150,153 | A | 9/1992 | Franken et al. | |
| 5,917,393 | A * | 6/1999 | Kupiszewski et al. | 335/216 |

(Continued)

FOREIGN PATENT DOCUMENTS

| | | |
|---|---|---|
| CN | 1233101 | 10/1999 |
| CN | 1477449 | 2/2004 |

(Continued)

OTHER PUBLICATIONS

Korean Office Action dated Aug. 29, 2012 in corresponding Korean Patent Application No. 10-2010-0057966.

(Continued)

*Primary Examiner* — Steven H Whitesell Gordon
(74) *Attorney, Agent, or Firm* — Pillsbury Winthrop Shaw Pittman LLP

(57) ABSTRACT

A positioning device includes a planar motor having a stator and a translator, one of the stator and the translator including a periodic magnet structure and another of the stator and the translator including at least one coil that is adapted to carry an electric current, wherein the coil includes a wound strip of sheet-like electrically conductive material, and wherein an edge of the coil is provided with a rounded profile.

11 Claims, 5 Drawing Sheets

(56) References Cited

U.S. PATENT DOCUMENTS

| | | | |
|---|---|---|---|
| 6,072,259 A * | 6/2000 | Kawabata et al. | 310/216.115 |
| 6,404,092 B1 * | 6/2002 | Baumann et al. | 310/201 |
| 6,768,240 B2 * | 7/2004 | Younsi et al. | 310/201 |
| 6,891,600 B2 | 5/2005 | Frissen et al. | |
| 2002/0081528 A1 * | 6/2002 | Miyajima et al. | 430/302 |
| 2002/0089239 A1 * | 7/2002 | Emoto et al. | 310/12 |
| 2004/0036848 A1 * | 2/2004 | Frissen et al. | 355/53 |

FOREIGN PATENT DOCUMENTS

| | | |
|---|---|---|
| GB | 2036456 A * | 6/1980 |
| JP | 2-056419 U | 4/1990 |
| JP | 6-036337 | 2/1994 |
| JP | 9-246067 | 9/1997 |
| JP | 11-162751 | 6/1999 |
| JP | 2005-285790 | 10/2005 |
| JP | 2008-507715 | 3/2008 |
| KR | 10-2003-0096008 | 12/2003 |

OTHER PUBLICATIONS

Taiwan Office Action dated Feb. 27, 2013 in corresponding Taiwan Patent Application No. 099118239.

* cited by examiner

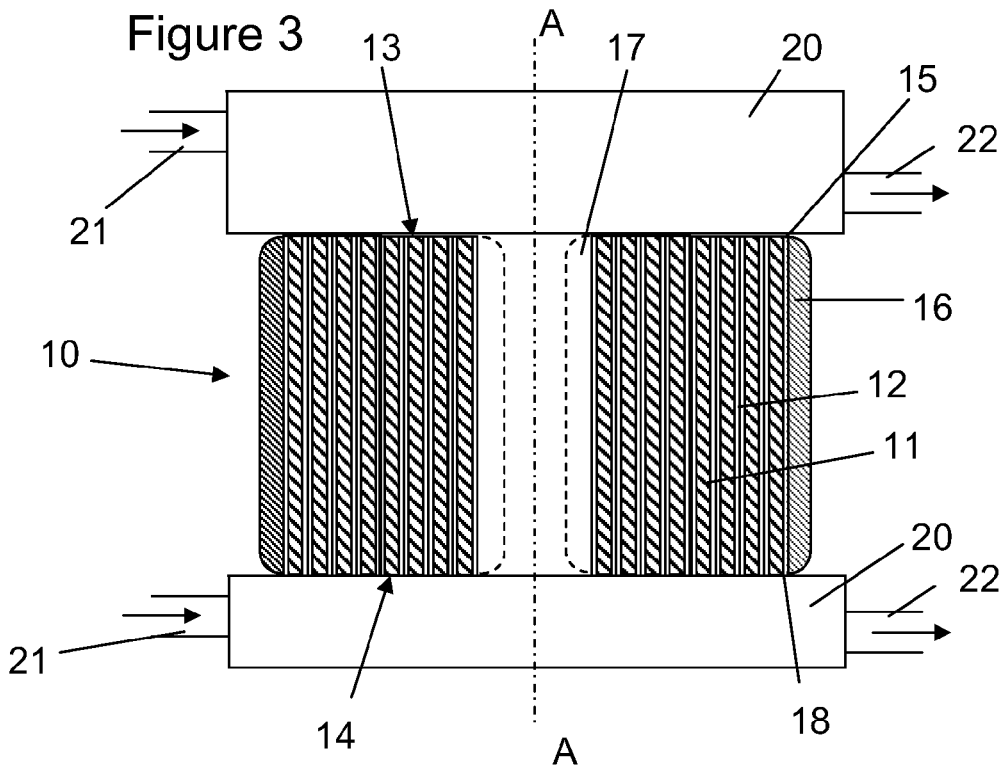
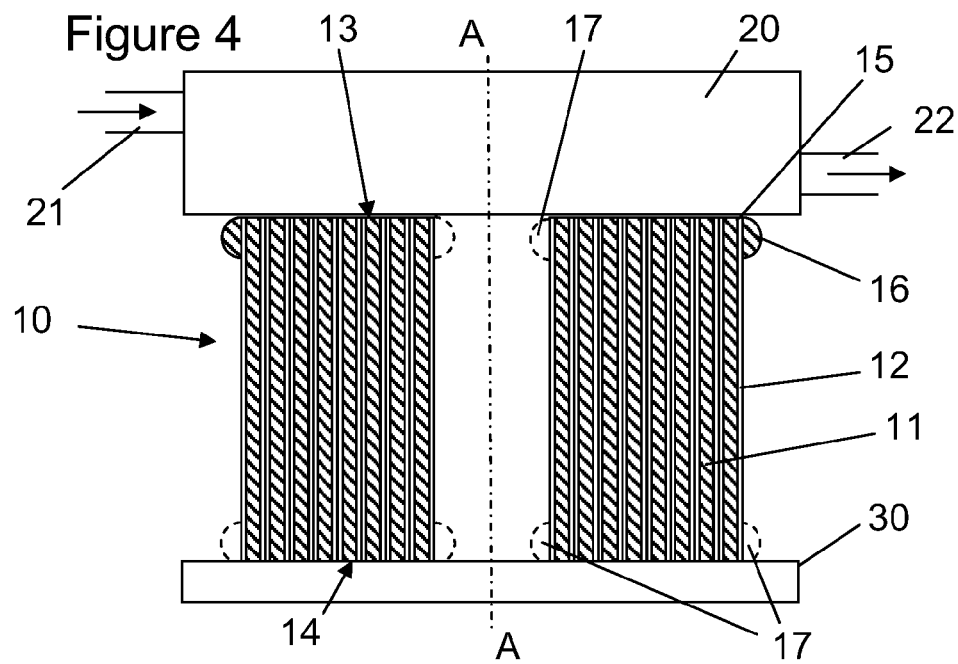

COIL, POSITIONING DEVICE, ACTUATOR, AND LITHOGRAPHIC APPARATUS

CROSS REFERENCE TO RELATED APPLICATIONS

This application claims priority and benefit under 35 U.S.C. §119(e) to U.S. Provisional Patent Application No. 61/218,692, entitled "Coil, Positioning Device, Actuator, and Lithographic Apparatus", filed on Jun. 19, 2009. The content of that application is incorporated herein in its entirety by reference.

FIELD

The present invention relates to a coil, positioning device, actuator and lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The positioning devices that are used in conventional lithographic apparatus to provide forces to move the patterning device support (e.g. mask table) MT and the substrate table WT usually include a plurality of actuators. The actuators include copper coils attached to one part of the apparatus and a magnet assembly attached to the other part of the apparatus. When a current is passed through such coil, the interaction of the current passing through the coil and the magnetic field generated by the magnet produces a force between two parts of the apparatus. The coils of conventional actuators are formed from insulated wire that is wound in an orthocyclic fashion. Such coil is formed from conductive wire, for instance copper wire wound about a winding axis. To prevent short circuits between respective turns of the copper wire, the wire is encased in an electrically insulating material.

With conventional coil designs made up of orthocyclically wound wire, the heat transmission through the coil is low. Each insulated piece of wire is only in line-contact with the adjacent pieces of wire, limiting the area across which heat may be conducted. Furthermore, the material used to electrically insulate the wires from one another tends to be a poor conductor of heat further reducing the heat transfer characteristic across the coil as a whole. Consequently, a significant portion of the heat generated on the inner side of the coil is dissipated to the environment surrounding the coil, rather than being transferred through the coil to cooling elements arranged close to the coil.

To avoid these drawbacks, U.S. Pat. No. 6,891,600, the contents of which is herein incorporated in its entirety by reference, proposes to provide in a positioning device of a lithographic apparatus a planar motor having a stator and a translator, one of the stator and the translator including a periodic magnet structure and the other of the stator and the translator including a plurality of coils that can carry an electric current, the coils include a strip of electrically conductive sheet-material. This provides a coil with improved heat transfer characteristics since heat is transferred across the width of the strips of electrically conductive sheet-material. This is beneficial because the electrically conductive material has a higher thermal conductivity than the insulating material used in conventional coil designs. Due to the use of a wound strip of sheet material a better heat transfer is obtained.

However, a drawback of coils made of a strip of sheet material is that they have relative sharp edges. These sharp edges in combination with a small distance of the coils with respect to other objects, for instance cooling plates, result in high electric field intensity near the edges of the coils. This is a critical volume for partial discharge initialization and more generally high field strength related breakdown and functional lifetime threatening effects.

SUMMARY

It is desirable to provide a motor including a coil without one or more drawbacks of conventional coil types and prior art coils including a strip of electrically conductive sheet-material.

According to an embodiment of the invention, there is provided a coil for a planar motor or actuator, including a wound strip of sheet-like electrically conductive material, wherein an edge of the coil is provided with a rounded profile.

According to an embodiment of the invention, there is provided a positioning device to position an object, the positioning device including a planar motor having a stator and a translator, one of the stator and the translator including a periodic magnet structure and another of the stator and the translator including at least one coil that is adapted to carry an electric current, wherein the coil includes a wound strip of sheet-like electrically conductive material, wherein an edge of the coil is provided with a rounded profile According to an embodiment of the invention, there is provided an actuator to produce a force between two parts when electric current is passed through a coil of the actuator, the coil including a wound strip of sheet-like electrically conductive material, wherein an edge of the coil is provided with a rounded profile.

According to an embodiment of the invention, there is provided a lithographic projection apparatus including: a radiation system to provide a projection beam of radiation; a patterning device support to support a patterning structure that patterns the projection beam according to a desired pattern; a substrate table to hold a substrate; a projection system to project the patterned beam onto a target portion of the substrate; and a positioning device to position at least one of the support structure and the substrate table, the positioning device including a planar motor having a stator and a translator, a first of the stator and the translator including a periodic magnet structure and a second of the stator and the translator including at least one coil that is adapted to carry an electric current, wherein the coil includes a wound strip of sheet-like electrically conductive material, and wherein an outer edge of the coil is provided with a rounded profile.

According to an embodiment of the invention, there is provided a lithographic projection apparatus including: a radiation system to provide a projection beam of radiation; a support structure to support a patterning structure that patterns the projection beam according to a desired pattern; a substrate table to hold a substrate; a projection system to project the patterned beam onto a target portion of the substrate; and an actuator to produce a force between two components of the lithographic apparatus when electric current is passed through a coil of the actuator, the coil including a wound strip of sheet-like electrically conductive material, wherein an edge of the coil is provided with a rounded profile.

In one embodiment, the edge is defined by the intersection of two substantially perpendicular surfaces of the coil. In another embodiment, the coil has a substantially cylindrical shape, and the edge is defined at an outer perimeter of a base of the cylindrical shape.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 depicts an embodiment of a coil according to the invention; and

FIGS. 4-7 depict alternative embodiments of coils according to the invention.

DETAILED DESCRIPTION

Figure 1:
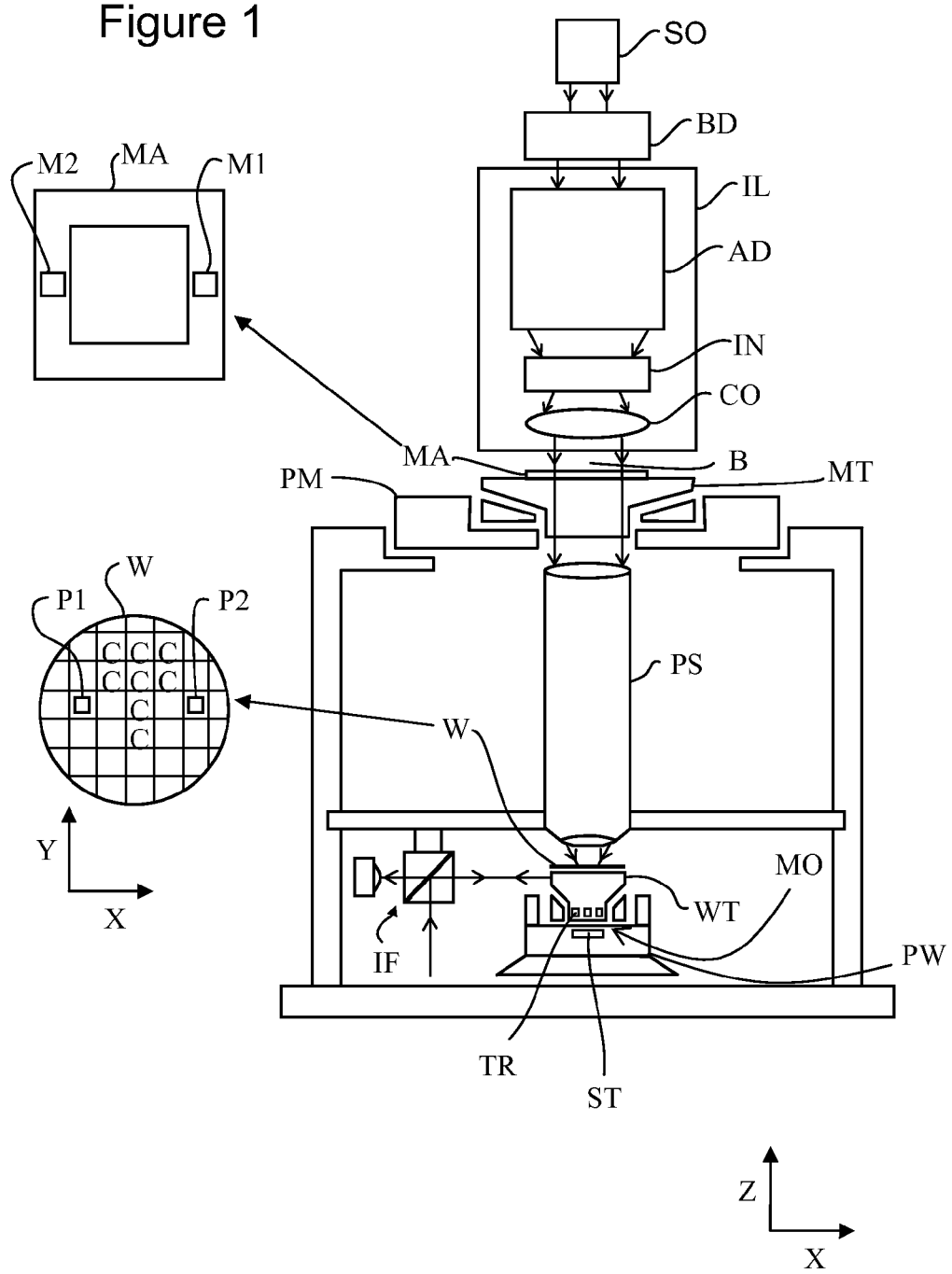
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The second positioner PW includes a planar motor MO including a stator ST formed by a plurality of coils and a translator TR formed by a permanent magnet structure.

Figure 2:
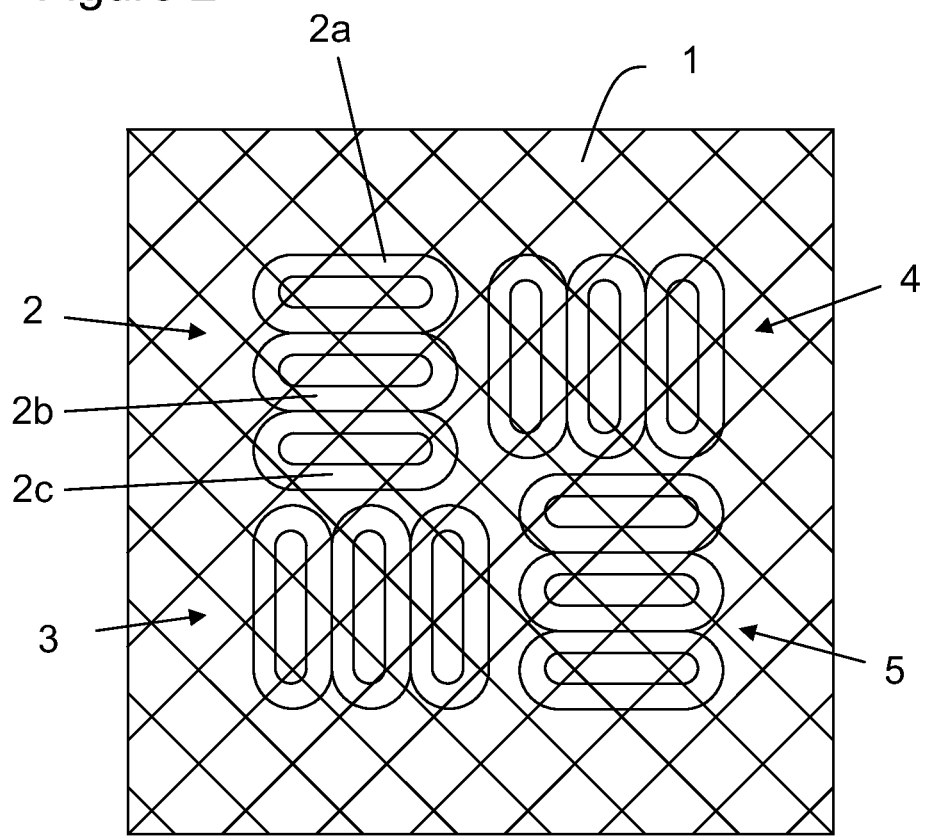
FIG. 2 depicts a planar motor including a coil according to the invention.

FIG. 2 schematically depicts a possible layout of such planar motor MO. The stator is formed by a magnet plate 1 which is schematically represented by the diagonal lines forming a pattern of squares. The translator of the planar motor is schematically depicted by 12 coils arranged in 4 coil units 2, 3, 4, 5, each coil unit including three coils 2a, 2b, 2c.

Such a planar motor arrangement is well suited to be used in vacuum applications since the motor can generate a horizontal force for acceleration and deceleration, but also a vertical force to levitate the translator from the magnet plate so that it can move frictionless in the horizontal plane. Therefore, a separated bearing is not required.

The use of light weight aluminum foil coils is found to be beneficial for such applications. Further details of a planar motor are for instance described in WO 01/18944A, which is incorporated herein by reference.

FIG. 3 depicts schematically a coil according to an embodiment of the invention generally indicated with the reference numeral 10. The coil 10 includes a sheet 11 of aluminum having a thickness of between about 50 and 150 µm, for instance approximately 60 µm. The sheet 11 is wound about a winding axis A-A. Any sheet or sheet like shape may be used as basis for a coil according to an embodiment the invention.

The width of the sheet of material is preferably between approximately 3 mm to 20 mm, for instance about 10 mm. The coil may include between about 100 and 300 turns and have a maximum external width of approximately 40 mm and an external length of approximately 350 mm. The coil 10 may also be formed from other electrically-conductive materials that can be formed into the required sheet-like, wound shape, such as copper.

In order to prevent electrical short circuits between respective turns of the coil, electrically non-conducting material is provided between the turns. This may be in the form of a separate insulating layer bonded to the strip of electrically conducting material before it is wound into the coil shape. However, as shown in FIG. 3, the sheet 11 of electrically conducting material has an integral surface 12 formed on it of electrically non-conducting material. When the sheet 11 is wound into the coil shape, the electrically non-conducting surface 12 prevents electrical short circuits between respective turns of the coil.

As the coil is formed from aluminum, the integral surface 12 may be formed of Al2O3, by anodizing the aluminum or, alternatively by chemical processes or by exposing the surface to oxygen. The anodizing process may, beneficially, be controlled to produce a uniform thickness of Al2O3 on the surface of the aluminum strip 21. Preferably the thickness of the Al2O3 layer is at least approximately 5 µm.

A cooling element 20 is arranged adjacent and preferably attached to the upper side 13 and to the lower side 14 of the coil 10. A flow of coolant may be provided to an inlet 21 and extracted from an outlet 22 to remove the heat absorbed by the respective cooling element 20. The cooling elements 20 are in direct thermal contact with the top side 13 and lower side 14 of the strip 12 of sheet-material from which the coil material is formed. Therefore, the heat generated in the coil 10 by the current passing through it may be transferred directly from the strip of sheet-material to the cooling element 20 without being transferred across a significant section of insulating material. A thin layer of insulating material may be desirable between the top side 13 of the strip of sheet-material and the upper cooling element 20 and between the lower side 14 and the lower cooling element 20 to prevent short circuits between respective turns of the coil, and the respective cooling element 20.

Adjacent to the outer side of the wound sheet 11, a profile element 16 of conductive material is arranged. The conductive profile element 16 has a substantially rectangular cross-section with rounded edges at one side of the rectangular, whereby the other side of the cross-section is placed against the wound sheet 11 of aluminum material. The profile extends from the upper outer edge 15 to the lower outer edge 18 of the wound sheet material 11. The profile element 16 extends approximately one winding about the circumference of the coil 16. As a result, the upper outer edge and the lower outer edge of the coil 10 have a rounded profile.

The conductive profile element 11 may be connected to the same potential as the sheet 11 of conductive material. This connection may be direct or via an extra resistance. In an alternative embodiment, multiple profile elements may be provided about the circumference of the coil to provide a rounded profile at at least one edge of the coil.

The profile element 16 may be made of any suitable conductive material such as copper or aluminum or alloys thereof, or any other conductive material.

The radius of the profile element 11, and thus the rounded profile is about 0.005 to 5 mm, preferably about 0.1 to 0.5 mm.

The benefit of a rounded profile at the edge of a coil is that high peaks in the field intensity due to sharp edges 15, 18 of the wound sheet in combination with a small distance of the coil 10 with respect to other objects, in particular the cooling element 20, are avoided.

When it is desirable to provide a rounded profile at any other edge of the coil, one or more conductive profile elements may be provided at that respective edge. For instance, to provide a rounded profile at an inner edges of the wound sheet 11, a conductive profile 17 (shown in dashed lines) may be provided.

In alternative embodiments the profile element 16 may have any other suitable cross section to provide a rounded profile at an edge of the coil 10.

FIG. 4 shows for instance a conductive profile element 16 having a semicircular cross-section, whereby the flat side of the cross-section is placed against the wound sheet of aluminum material. The profile element 16 extends approximately one winding about the circumference of the coil 16. The profile element 16 of FIG. 4 provides a rounded profile at the upper outer edge of the coil.

In the embodiment of FIG. 4, there is only one cooling element 20 provided at the top of the coil 10. A plate 30 of suitable material for instance a non-conductive material may be attached to the lower side 14 of the coil 10 to prevent damage to the coil from any impact.

When desired, further profile elements 17 may be arranged at edges of the coil to provide rounded profiles at other edge of the coil (shown in dashed lines). This may for instance be desirable when the plate 30 would be made of conductive material, for instance stainless steel, or when a cooling element would be arranged at a lower side of the coil.

Figure 5:
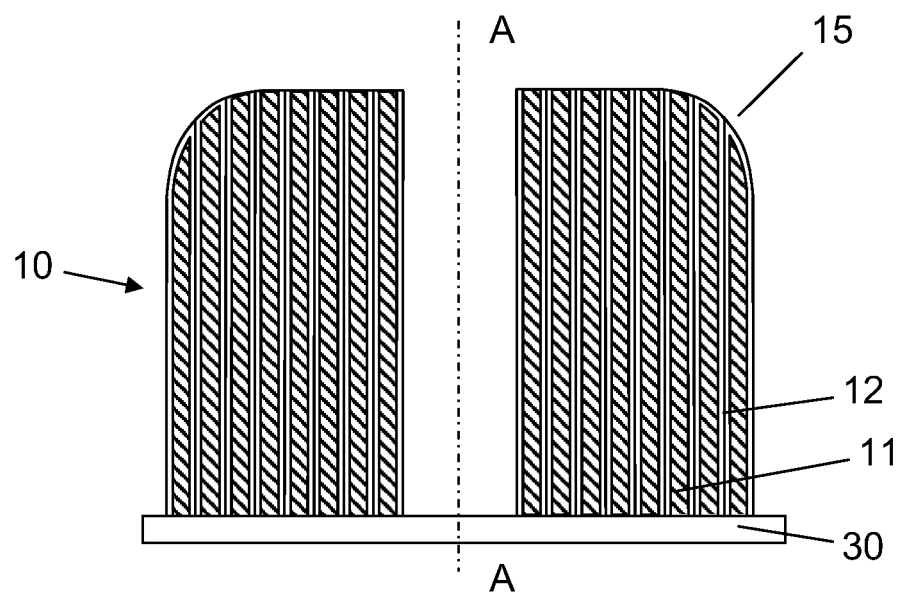
Figure 6:
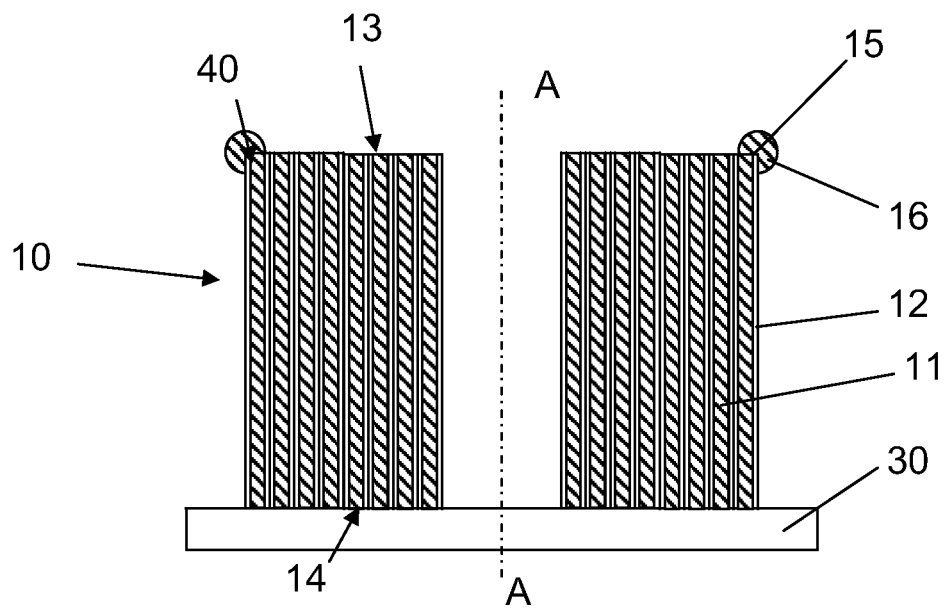
Figure 7:
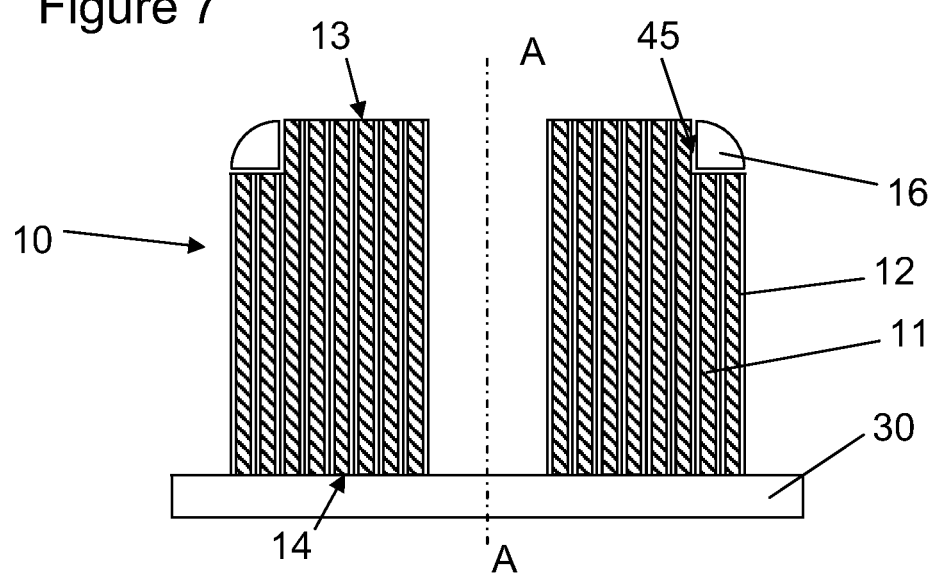

FIGS. 5-7 show further alternative embodiments of coils being provided with a rounded profile. In the shown embodiments the rounded profile is provided at the upper outer edge 15 of the strip of conductive material 15. However, the rounded profile may, when desired, also be provided at any other edge of the wound strip 11. The parts of the coil 10 and the plate 30 are the same as shown in FIGS. 3 and 4 and indicated with the same reference numerals, unless described otherwise.

In the embodiment of FIG. 5, the outer windings of the sheet 11 have been made gradually lower to provide a rounded profile at the upper outer edge 15 of the wound sheet 11. In this embodiment, this outer edge 15 also forms the outer edge of the coil 10. The benefit of this embodiment is that no separate element has to be provided, but manufacturing this coil may be more difficult.

The outer windings may be made lower before or after winding of the sheet 11 of conductive material, for instance by cutting the sheet before winding or precision machining before or after winding of the foil followed by a proper treatment to restore insulating properties for instance by anodizing, or by covering the conductive material with an insulating coating, for instance poly(p-xylylene) polymers (parylene) or other suitable dielectrics.

In FIG. 5, it appears that a large number of windings are used for forming a rounded profile. However, in an embodiment, there are many windings and only a limited number of windings have to be used to provide a rounded profile of the edge of the coil.

In FIG. 6, an embodiment of a coil is shown wherein a profile element 16 is arranged at the upper outer edge 15 of the wound strip 11 of conductive material. The profile element 16 has a cross-section of three quarters of a circle. In the space 40 of the missing quarter the upper outer edge 15 of the wound sheet 11 is placed so that the three quarters of a circle provide a rounded profile at the upper outer edge of the coil. As an alternative to the profile element 16 of FIG. 6, also a strip of electrically conductive bendable material, such as a strip of aluminum may be bend about the edge 15 to provide a rounded profile on this edge.

FIG. 7 shows an embodiment wherein in the outer windings of the strip of conductive material 11 the height has been adapted so that after winding of the strip 11, a rectangular space 45 is provided at the outer upper edge 16 of the strip 11. In this space 45, an elongate profile element 16 having a cross-section of a quarter circle is arranged. The arc shaped side is arranged at the upper outer side of the coil 10 so that the coil 10 is provided with a rounded profile.

Hereinabove the provision of a coil in a planar motor of a positioning device has been described. The coil of the invention may also be used in other applications, such as any actuator in a lithographic apparatus (for example for actuating the patterning device support or the substrate table) or other application wherein a coil is used within and outside the field of lithography.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as charged particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A coil for a planar motor or actuator, the coil comprising:
    a wound strip of sheet-like electrically conductive material that is wound about an axis, the coil having a substantially cylindrical shape;
    a flat top and bottom portions made of said material and substantially perpendicular to the axis,
    wherein an edge of the coil made of said electrically conductive material is substantially parallel to said axis over substantially an entire length thereof and wherein an outer edge of the coil defined by an intersection between the edge and the flat top or bottom portion is provided with a rounded profile.

2. The coil of claim 1, wherein the rounded profile is formed by a conductive profile element arranged about the wound strip of sheet-like electrically conductive material.

3. The coil of claim 2, wherein the strip of sheet-like electrically conductive material and the conductive profile element are connected to a same potential.

4. The coil of claim 1, wherein at least an edge part of the strip of sheet-like electrically conductive material is rounded to form the rounded profile.

5. The coil of claim 1, wherein the rounded profile is formed by a plurality of outer windings of the wound strip of sheet-like electrically conductive material, the outer windings being shaped to form the rounded profile.

6. The coil of claim 5, wherein the outer windings are machined to obtain the rounded profile, and wherein, after machining, insulation properties are restored by proper treatment.

7. A positioning device to position an object, the device comprising a planar motor having a stator and a translator, a first of the stator and the translator comprising a periodic magnet structure and a second of the stator and the translator comprising a coil that is adapted to carry an electric current, wherein the coil comprises
    a wound strip of sheet-like electrically conductive material that is wound about an axis, the coil having a substantially cylindrical shape, a flat top and bottom portions made of said material and substantially perpendicular to the axis,
    wherein an edge of the coil made of said electrically conductive material is substantially parallel to said axis over substantially an entire length thereof and wherein an outer edge of the coil defined by an intersection between the edge and the flat top or bottom portion is provided with a rounded profile.

8. The positioning device of claim 7, wherein the planar motor further comprises a cooling element adjacent to and in thermal contact with the coil, and wherein the rounded profile is arranged adjacent to the cooling element.

9. An actuator configured to produce a force between two parts when electric current is passed through a coil of the actuator, the coil comprising
    a wound strip of sheet-like electrically conductive material that is wound about an axis, the coil having a substantially cylindrical shape, a flat top and bottom portions made of said material and substantially perpendicular to the axis,
    wherein an edge of the coil made of said electrically conductive material is substantially parallel to said axis over substantially an entire length thereof and wherein an outer edge of the coil defined by an intersection between the edge and the flat top or bottom portion is provided with a rounded profile.

10. A lithographic projection apparatus comprising:
a patterning device support to support a patterning structure configured to pattern a projection beam according to a desired pattern to form a patterned beam;
a substrate table to hold a substrate;
a projection system to project the patterned beam onto a target portion of the substrate; and
a positioning device to position one of the support structure and the substrate table, the positioning device comprising a planar motor having a stator and a translator, a first of the stator and the translator comprising a periodic magnet structure and a second of the stator and the translator comprising a coil that is adapted to carry an electric current, wherein the coil comprises a wound strip of sheet-like electrically conductive material that is wound about an axis, the coil having a substantially cylindrical shape, a flat top and bottom portions made of said material and substantially perpendicular to the axis, and wherein an outer edge of the coil made of said electrically conductive material is substantially parallel to said axis over substantially an entire length thereof and wherein an outer edge of the coil defined by an intersection between the edge and the flat to or bottom portion is provided with a rounded profile.

11. A lithographic projection apparatus comprising:
a patterning device support to support a patterning structure configured to pattern a projection beam according to a desired pattern to form a patterned beam;
a substrate table to hold a substrate;
a projection system to project the patterned beam onto a target portion of the substrate; and
an actuator to produce a force between two components of the lithographic apparatus when electric current is passed through a coil of the actuator, the coil comprising a wound strip of sheet-like electrically conductive material that is wound about an axis, the coil having a substantially cylindrical shape, a flat top and bottom portions made of said material and substantially perpendicular to the axis, wherein an edge of the coil made of said electrically conductive material is substantially parallel to said axis over substantially an entire length thereof and wherein an outer edge of the coil defined by an intersection between the edge and the flat top or bottom portion is provided with a rounded profile.

* * * * *